United States Patent [19]

Hickling

[11] Patent Number: 4,837,781
[45] Date of Patent: Jun. 6, 1989

[54] PHASE LOCKED LOOP CLOCK SYNCHRONIZER AND SIGNAL DETECTOR

[75] Inventor: Ronald M. Hickling, Simi Valley, Calif.

[73] Assignee: Gigabit Logic, Inc., Newbury Park, Calif.

[21] Appl. No.: 35,567

[22] Filed: Apr. 7, 1987

[51] Int. Cl.[4] .......................... H03D 3/18; H03D 3/24
[52] U.S. Cl. ...................................... 375/81; 375/120; 331/11; 329/50
[58] Field of Search .......................... 375/81, 120, 102; 329/50, 109, 122; 331/11, 12

[56] References Cited

U.S. PATENT DOCUMENTS

| | | | |
|---|---|---|---|
| 3,906,376 | 9/1975 | Bass | 375/81 |
| 3,908,115 | 9/1975 | Waggener | 375/120 |
| 4,218,771 | 8/1980 | Hogge, Jr. | 375/120 |

*Primary Examiner*—Robert L. Griffin
*Assistant Examiner*—Marianne Huseman
*Attorney, Agent, or Firm*—Lyon & Lyon

[57] ABSTRACT

A phase locked loop system is described for synchronizaing a clock signal to an incoming digital signal and simultaneously detecting that digital signal. The loop is capable of unaided frequency acquisition, hence eliminating the need for special circuits to "pull" the loop into lock when the incoming data rate differs from the initial frequency of the VCO.

4 Claims, 4 Drawing Sheets

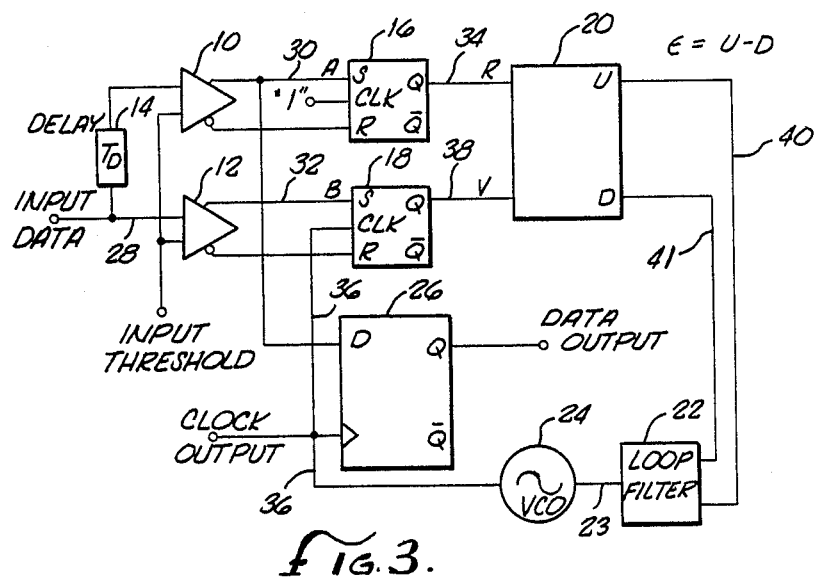
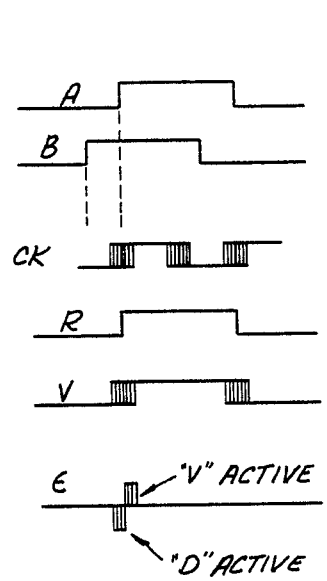
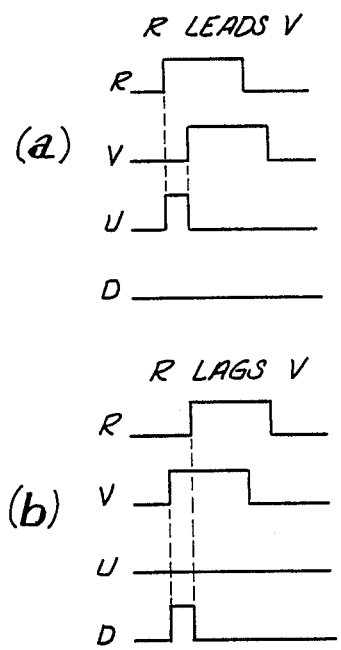
FIG.3.
FIG.4.
FIG.5.

PHASE LOCKED LOOP CLOCK SYNCHRONIZER AND SIGNAL DETECTOR

BACKGROUND

There are many techniques available for clock synchronization, however, all practical techniques fall into two basic schemes; (1) a resonator which is excited by rising and falling edges of received data and (2) a phase-locked loop which servos the clock to a fixed phase with respect to the rising and falling edges of the input data.

The resonator based scheme has two basic problems. First, the exact throughput delay of the resonator system is critical because signal detection, deciding between a "1" and "0", is done in a separate stage which utilizes the recovered clock. Keeping the throughput delay constant is difficult because of "slow" effects such as temperature and "fast" effects such as delay variation introduced by input amplitude variation. Second, the resonator circuit has a specific resonance which restricts the tunability of the click recovery circuit to the pass band of the resonant circuit. It is generally unlikely that the incoming data signal exactly matches the natural resonance of a high Q resonator, particularly since the resonant frequency tends to shift with aging. This mismatch causes two undesirable effects. First, the clock output can be severely attenuated because the roll off of the resonator response characteristic is fairly steep. Second, in the absence of data edges, the clock output frequency will drift toward the natural resonant frequency of the circuit curing "flywheeling".

The phase-locked loop (PLL) approach does not exhibit the timing problems mentioned above since signal detection and clock recovery are all performed in one loop. Furthermore, phase-locked loops possessing a narrow loop bandwidth, equivalent to high Q, and relatively wide tuning range are easily designed and are more tolerant to component parameter variations. A PLL using a "sample and hold" type phase detector with a narrow loop bandwidth will "hold" its frequency when no transitions occur because the phase detector does not drive the VCO in either direction. The most practical approach to a high frequency PLL circuit is an analog approach because high resolution digital PLL circuits require impractically high master clock frequencies.

Two prior art circuits of the closed-loop clock extraction type are the "Early-Late Gate Synchronizer" shown in FIG. 1, and "Signal Detection Apparatus", shown in FIG. 2 which corresponds to FIG. 3 of U.S. Pat. No. 4,535,454. The Early-Late Gate Synchronizer is a completely analog clock extraction loop which utilizes two integrate-and-dump filters for signal detection and phase error signal generation, while the Signal Detection Apparatus utilizes a pair of edge-triggered D flip-flops for this purpose.

The primary drawback of the "Early-Late Gate Synchronizer" is its need for an integrate-and-dump filter which is capable at operating at high speeds. The Signal Detection Apparatus circuit of FIG. 2 is capable of operating up to the maximum clock frequency of the edge-triggered D flip-flops, which is in general much higher than that of currently available integrate-and-dump filters. However, this loop is not capable of producing the beat notes required for unaided frequency acquisition.

SUMMARY OF THE INVENTION

The system of the present invention utilizes two S-R latches, one of which is held transparent while the other is clocked by a voltage controlled oscillator. The function of this transparent latch is to replicate the delay through the clocked latch. Phase comparison is accomplished by comparing the output of the transparent latch or unclocked data to that of the clocked latch. In frequency lock, that is when the clock frequency is equal to the input data rate, the clocked latch acts as a clock controlled delay. Phase-lock is accomplished when the rising edges of the output signals of the two S-R latches are coincident causing the error voltage from a phase/frequency comparator to be zero. In this condition, the rising edge of the clock lags the rising edge of the input data by a delay introduced into the data signal fed into the transparent S-R latch. The signal detection is performed by a separate falling edge-triggered "D" type flip flop. Since the lock point of the loop requires that the data input to the "D" type flip-flop match the rising edge of its clock input, maximum timing margin is ensured.

The invention utilizes a rising edge-triggered phase comparison scheme which has an output characteristic that is continuous and monotonic as long as the loop transient phase error is between $-(360 \times \text{Data Rate(Hz)} \times T_D(\text{seconds}))$ degrees and $+18020$. If the delay period $T_D$ is chosen to be $\frac{1}{2}$ of the data rate then the operating range is 360°.

In contrast, the circuit in FIG. 1 is only continuous and monotonic over a total loop phase error range of 180 degrees. Outside this range, the slope of this phase detection scheme reverses sign.

Although continuous for loop phase error between 0° and 360°, the edge-triggered flip-flop detector of FIG. 2 is incapable of generating useful phase information when the rate of incoming random data does not match the frequency of the VCO. This problem is solved by the use of a clocked S-R latch. The function of this latch is identical to that of an edge-triggered flip flop when the incoming data rate matches the VCO frequency. However, when the incoming data rate does not match the VCO frequency, the latch, which is transparent for one half of a VCO clock cycle, allows "beat notes" to pass through the phase detector causing the VCO frequency to move toward the input data rate.

This present system is an improvement over prior art because (1) is has better frequency acquisition characteristics, and (2) it is more efficient at UHF data rates and higher, as opposed to high resolution digital loops that require impractically high master clock frequencies and completely analog loops such as that shown in FIG. 1 which are difficult to build and require special analog components.

BRIEF DESCRIPTION OF THE DRAWINGS

3. FIG. 3 is a block diagram of the present invention which is a PLL Clock Synchronizer and Signal Detector.

4. FIG. 4 is a timing diagram showing signal states when the VCO frequency equals the input data rate.

5. FIGS. 5a and 5b show output of the phase/frequency comparator when signal R leads signal V (5a) and when signal R lags signal V (5b).

DETAILED DESCRIPTION

Figure 1:
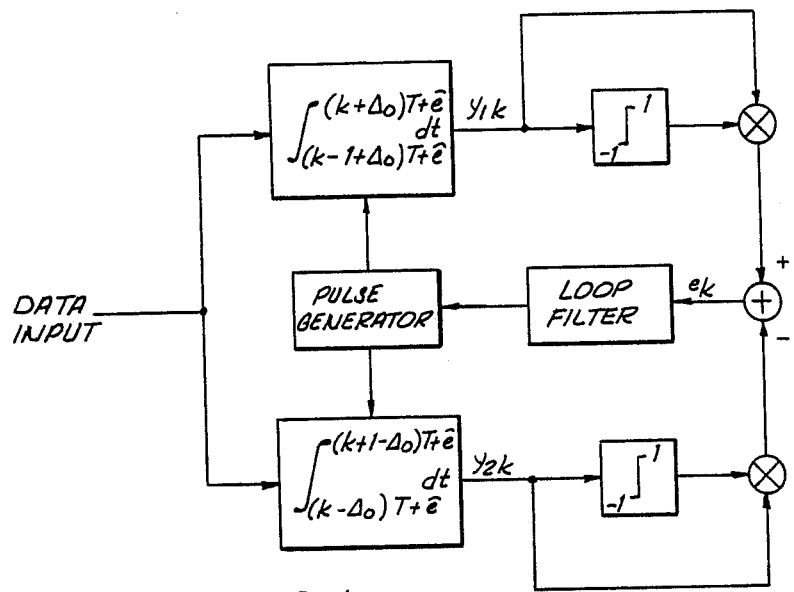
FIG. 1 is a prior art block diagram of an Early-Late Gate Synchronizer.

A block diagram of the present invention appears in FIG. 3. The constituent elements are: input comparators 10 and 12 with complementary outputs, a delay element 14, set-reset latches 16 and 18, a phase/frequency comparator 20, a loop filter 22, a voltage controlled oscillator (VCO) 24, and an edge-triggered "D" type flip-flop 26. The phase/frequency comparator 20 is a standard digital building block and it is used for its edge triggered properties. The same is also true of the VCO 24 and loop filter 22, all of which are general building blocks of a phase-locked loop. The phase detection function is performed by the set-reset latches 16 and 18 and the phase/frequency comparator 20. The latch 16 is held "transparent" by holding its clock input (CLK) high. Latch 16 is used for delay matching purposes; whereas, latch 18 is clocked by the VCO 24.

OPERATION IN THE PRESENCE OF A SIMPLE PHASE OFFSET

When the VCO 24 frequency is equal to the input data rate on line 28, that is, when the loop is in frequency lock but not phase-locked, the outputs U and D of the phase/frequency comparator 20 will produce pulses which will drive the VCO frequency in a direction which will correct this phase offset. This process is shown by the timing diagram in FIG. 4. Signals "A" and "B" on lines 30 and 32 are the respective inputs to the set-reset latches 16 and 18. Signal A lags signal B by an amount determined by the delay element ($T_D$) 14. The set-reset latch 16 is not clocked and is transparent, causing the output of the latch 16, or signal "R" on line 34, to lag the input signal A on line 30 by the propagation delay of the latch 16 (which is assumed negligible in the timing diagram). The output of the set-reset latch 18, however, does not occur until the VCO clock signal on line 36 goes high. The signal V on line 38 leads the signal R on line 34 when the rising edge of the VCO clock signal, on line 36, leads the signal A on line 30. Note that if the VCO clock signal leads the signal A on line 30 by an amount more than $T_D$, then the rising edge of the V signal on line 38 is determined by the rising edge of the signal on line 32. Thus signal V will lead signal R by $T_D$.

The relative phase of signal V with respect to signal R is sensed by the phase/frequency comparator 20. The phase/frequency comparator 20 is an edge-triggered digital device which produces pulses on output "U" when signal R leads signal V and on output "D" when signal R lags signal V. The width of these pulses is equal to the amount by which signal R on line 34 leads or lags signal V on line 38. Only one output of the phase/frequency comparator 20 is active at any time. The difference between the outputs U and D, denoted "ε" in FIG. 3, is fed back to the VCO 24 through an appropriate loop filter 22, which then servos the VCO 24 in the direction necessary to correct the phase offset between signals R and V. A loop filter can be one of several types of lowpass filters depending on the application. Second order loops generally use one of the following filter types:

$$\text{passive: } F(s) = \frac{sT_2 + 1}{sT_1 + 1} \text{ (lag filter)}$$

$$\text{active: } F(s) = \frac{sT_2 + 1}{sT_1} \text{ (lead-lag filter)}$$

Higher order loops (using higher order loop filters) are also possible.

When the loop is in lock, the rising edge of signal A is exactly lined up with the rising edges of the VCO clock. This ensures that the falling edge-triggered "D" type flip-flop 26, which is used as a decision circuit to detect the digital data, is clocking precisely in the middle of an input data bit, and thus has maximum timing margin to prevent jitter induced bit errors.

OPERATION WHEN THE INITIAL VCO FREQUENCY IS UNEQUAL TO THE INPUT DATA RATE (FREQUENCY ACQUISITION)

One important function a phase detector must perform in the "pull-in", or frequency acquisition process, is the production of either a constant voltage indicating the direction of frequency error, or "beat notes" which drive the VCO in a direction which will correct the frequency error.

Figure 2:
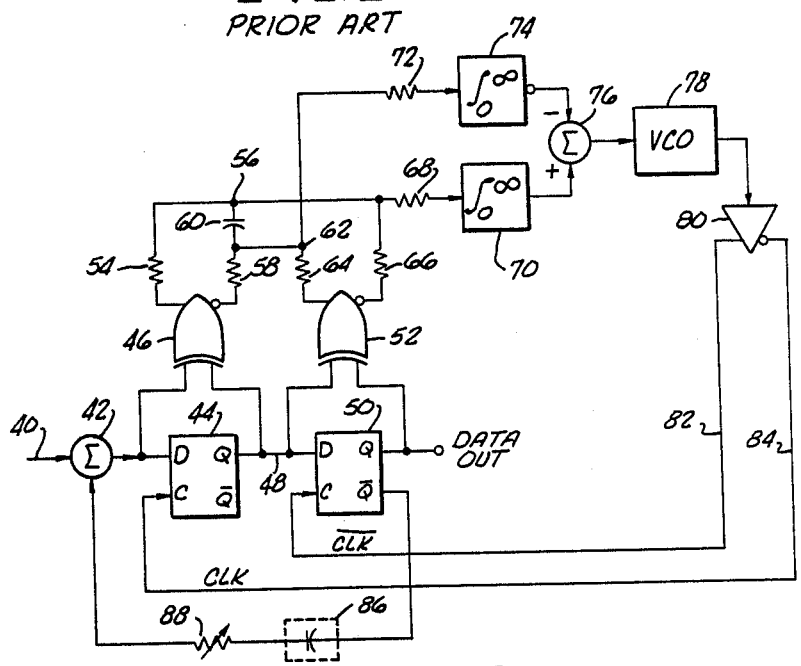
FIG. 2 is a prior art schematic drawing of a Signal Detection Apparatus.

As outlined in the previous section, the phase detection function in this loop is obtained by comparing the incoming data signal or line 28 with a version of the same data signal retimed by the VCO clock signal. In prior art loops of this type, specifically the "Signal Detection Apparatus" shown in U.S. Pat. No. 4,535,459, the retiming function has commonly been performed by an edge-triggered "D" flip-flop with an exclusive OR logic gate used as the phase detector as shown in FIG. 2. Unfortunately, these loops are unable to produce "beat notes" which are capable of "pulling" the VCO frequency in the direction of the incoming data rate. The acquisition range for phase-locked loops can be estimated by noting their response to a step discontinuity in frequency. As an example, consider a second order loop with an ideal lead-lag loop filter:

$$F(s) = \frac{sT_2 + 1}{sT_1}$$

The peak transient phase error to a discontinuous jump in frequency (step) is given by the formula:

$$\text{Peak error} = \frac{\Delta\omega}{\omega_n} \cdot \frac{1}{2\delta}$$

$$\text{where } \omega_n = \sqrt{\frac{K_d K_v}{T_1}} \text{ and } \delta = \frac{\omega_n T_2}{2}$$

$K_d$ = phase detector gain $K_v$ = VCO conversion gain

Since the phase detector characteristic is continuous for $$-\pi < \phi < \pi \text{ assuming } T_D = \frac{1}{2} \cdot \frac{1}{\text{DATA RATE}}$$

-continued $$\frac{\Delta\omega}{\omega_n} \cdot \frac{1}{2\delta} \leq \pi \text{ or}$$

peak transient phase error $\leq \pi$ $$\Delta\omega \leq \frac{\pi\omega_n}{2\delta}$$

the capture range is $2\Delta\omega$

Note that phase detectors which are valid over $\frac{\pi}{2} < \phi < \frac{\pi}{2}$ cut this $\Delta\omega$ in half.

The present invention is an improved phase detection scheme which allows unaided frequency acquisition. First, by using the clocked set-reset latch 18 to perform the retiming instead of an edge-triggered D flip-flop, the number of transitions in signal V on line 38 is equal to the number of transitions in the signal R on line 34, although offset in time. This holds true for any input data rate that is within the capture range of the loop. Second, since a phase/frequency comparator 20 is used to measure the time skew between the signal R and the signal V rising edges, variation in the pulse width of the signal V, which will occur when the VCO frequency is not equal to the incoming data rate, does not affect the phase measurement. In contrast, an exclusive OR gate, which measures phase error by the amount of overlap in the signals R and V on lines 34 and 38, would be affected by such a variation.

The phase comparator is continuous over -(360 X DATA RATE X $T_D$) < transient phase error < 180°. This is best explained by referring to FIG. 3. Because of the fixed delay $T_D$, signal A (line 30) always lags signal B (line 32) by $T_D$, the output signal on line 38 of the clocked S-R latch 18 occurs slightly after the occurrence of the clock rising edge on line 36. However this is only true if the clock rising edge occurs at the same time as or after the rising edge of signal B on line 32. Otherwise signal R on line 34 will lead signal V on line 38 by a constant delay $T_D$. If the delay is chosen to be half of a bit period of the input data rate, the total range of operation of the phase detector is 360 degrees. Furthermore, the slope of the $\epsilon$ versus phase error curve never changes sign.

FIG. 5a shows that when signal R on line 34 leads signal V on line 38, there is an output signal from the U output of phase/frequency comparator 20. Similarly, when signal R lags signal V there is an output from the D output of the phase/frequency comparator 20.

Figure 6A:
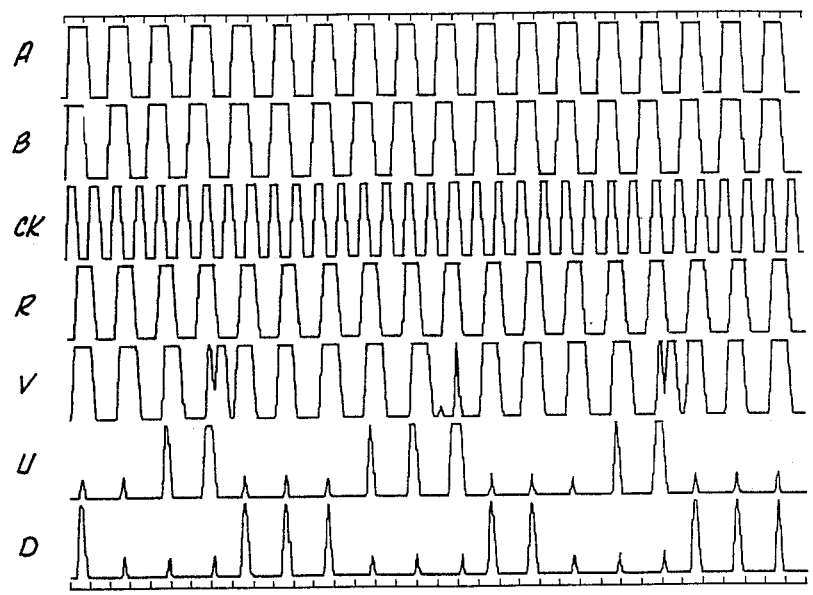
FIGS. 6a and 6b are timing diagrams showing signal states when the VCO frequency is less than the data rate (6a) and when the VCO frequency is greater than the data rate (6b).
Figure 6B:
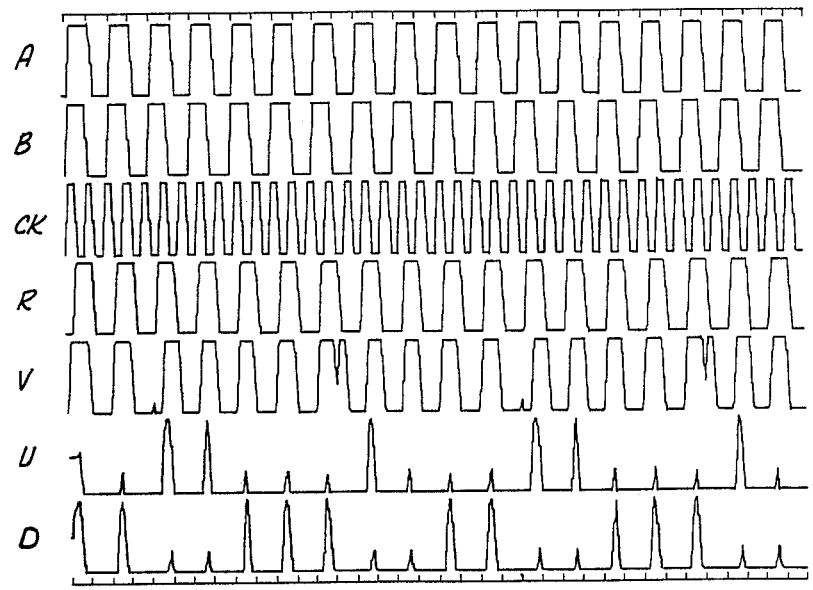

FIGS. 6a and 6b show a computer simulation of the production of beat notes for the cases when the VCO frequency on line 36 is less than the data rate (FIG. 6a) and when the VCO frequency is greater than the data rate (FIG. 6b). The letters A, B, CK, R, V, U and D of FIGS. 6a and 6b correspond, respectively, to the signals on lines 30, 32, 36, 34, 38, 40 and 41 of FIG. 3. Note that the signal $\epsilon = U - D$ and that the relative duty cycles of the U and D signal point the VCO in the proper direction of frequency change in order to match the incoming data rate on line 28 (FIG. 3). The capture range of the loop is a function of the standard PLL parameters such as the phase detector gain, loop filter bandwidth, VCO control gain, and the chosen delay $T_D$.

Figure 7:
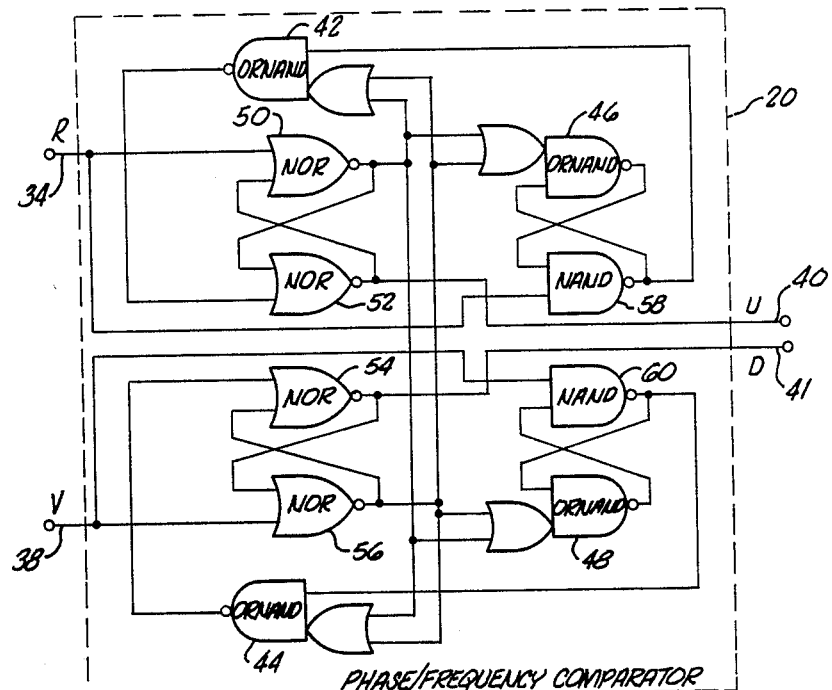
FIG. 7 is a schematic diagram of a phase/frequency comparator.

FIG. 7 is a schematic diagram of a specific example of the phase/frequency comparator 20 shown in FIG. 3. Signal R and signal V are fed to the phase/frequency comparator on lines 34 and 38 and the U and D output signals are on lines 40 and 41 respectively. Gates 42, 44, 46 and 48 are ORNAND gates, gates 50, 52, 54 and 56 are NOR gates and gates 58 and 60 are NAND gates.

Figure 8:
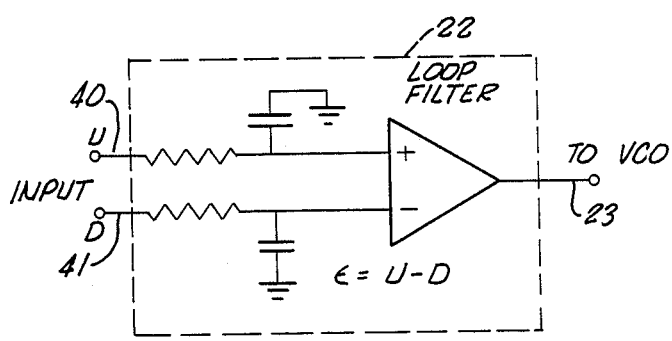
FIG. 8 is a schematic diagram of a loop filter.

FIGS. 8 is an expanded block diagram of the loop filter 22. The signals on lines U and D are fed to the loop filter on lines 40 and 41, respectively. The output of the loop filter is fed to the VCO 24 on line 23. Note that the summation, $\epsilon = U - D$, is performed by the loop filter.

While a preferred embodiment of the present invention has been illustrated and described, modifications and variations thereof will be apparent to those skilled in the art given the techniques herein, and it is intended that all modifications and variations be encompassed within the scope of the appended claims.

What is claimed is:

1. A phase-locked loop signal detector and synchronizer comprising time delay means for receiving and delaying input data, first comparator means connected to said time delay means for receiving delayed input data and a reference voltage, second comparator means for receiving input data and a reference voltage, first and second latch means wherein said first latch means is connected to said first comparator means for receiving delayed input data and said second latch means is connected to said second comparator means for receiving input data, phase/frequency comparator means connected to said first and second latch means for receiving output signals of said first and second latch means and detecting phase or frequency differences between said output signals and producing an error signal corresponding to said phase or frequency difference, loop filter means connected to said phase/frequency comparator means for receiving said error signal and producing a drive signal corresponding to said error signal, and oscillator means connected to said loop filter means for receiving said drive signal and producing a clock frequency signal that changes in response to said drive signal, said clock frequency signal connected to said second latch means for clocking said second latch means.

2. A system as in claim 1 including flip-flop means connected to said oscillator means and said first comparator means for receiving said delayed data from said first comparator means and being clocked by said clock frequency signal and producing a data output that is synchronized with said clock frequency signal.

3. A phase-locked loop signal detector and synchronizer comprising time delay means for receiving and delaying input data, first comparator means connected to said time delay means for receiving delayed input data and a reference voltage, second comparator means for receiving said input data and a reference voltage, first set-reset latch means connected to said first comparator means for receiving delayed input data and wherein the clock input of said first set-reset latch means is held high, second set-reset latch means connected to said second comparator means for receiving input data, phase/frequency comparator means connected to said first and second set-reset latch means for receiving output signals from said first and second set-reset latch means and detecting the phase or frequency difference between said output signals and producing an error signal corresponding to said phase or frequency difference, loop filter means connected to said phase/frequency comparator means for receiving said error signal and producing a VCO drive signal corresponding to said error signal, voltage controlled oscillator means connected to said loop filter means for receiving said VCO drive signal and producing a clock frequency signal that changes in response to said VCO drive signal, said clock frequency signal connected to said second latch means for clocking said second latch means, and flip-flop means connected to said voltage controlled oscillator means and said first comparator means for receiving said delayed input data from said first comparator means and being clocked by said clock frequency signal and producing a data output that is synchronized with said clock frequency signal.

4. A method of phase-locked loop signal detection and signal synchronization comprising the steps of receiving input data, delaying input data, generating propagation delay for said delayed input data, latching input data in a clocked latch, detecting the phase or frequency difference between an output signal of said clocked latch and said delayed input data and producing an error signaling response to said phase or frequency difference, producing a drive signal corresponding to said error signal, producing a click frequency signal that changes in response to said drive signal, clocking said clocked latch with said clock frequency signal, and receiving said delayed input data in a flip flop clocked by said clock frequency signal and producing a data output from said flip flop that is synchronized with said clock frequency signal.

* * * * *